United States Patent
Ku

(10) Patent No.: US 9,489,992 B2
(45) Date of Patent: Nov. 8, 2016

(54) SEMICONDUCTOR DEVICE AND SEMICONDUCTOR SYSTEM INCLUDING THE SAME

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/018,017

(22) Filed: Feb. 8, 2016

(65) Prior Publication Data

US 2016/0155483 A1 Jun. 2, 2016

Related U.S. Application Data

(62) Division of application No. 14/106,821, filed on Dec. 15, 2013, now Pat. No. 9,287,855.

(30) Foreign Application Priority Data

Oct. 8, 2013 (KR) ........................ 10-2013-0119845

(51) Int. Cl.
*G11C 7/10* (2006.01)
*H03K 3/037* (2006.01)
*G11C 7/22* (2006.01)

(52) U.S. Cl.
CPC ........... *G11C 7/1039* (2013.01); *G11C 7/1087* (2013.01); *G11C 7/1093* (2013.01); *H03K 3/0375* (2013.01); *G11C 7/106* (2013.01); *G11C 7/1051* (2013.01); *G11C 7/1057* (2013.01); *G11C 7/1078* (2013.01); *G11C 7/22* (2013.01)

(58) Field of Classification Search
CPC ..... G11C 7/1051; G11C 7/1078; G11C 7/22; G11C 7/106; G11C 7/1057

USPC ................................... 365/193, 189.05, 194
See application file for complete search history.

(56) References Cited

U.S. PATENT DOCUMENTS

| | | | | |
|---|---|---|---|---|
| 5,809,320 A | * | 9/1998 | Jain ....................... | G06F 9/3857 712/34 |
| 6,772,312 B2 | * | 8/2004 | Mes ..................... | G11C 7/1039 365/194 |
| 2001/0042162 A1 | * | 11/2001 | Mes ..................... | G11C 7/1039 711/105 |
| 2006/0104126 A1 | * | 5/2006 | Park ..................... | G11C 7/1066 365/189.05 |
| 2007/0070715 A1 | * | 3/2007 | Kim ........................ | G11C 7/20 365/189.05 |
| 2010/0246279 A1 | * | 9/2010 | Kim ..................... | G11C 7/1039 365/189.05 |
| 2011/0219208 A1 | * | 9/2011 | Asaad ..................... | G06F 15/76 712/12 |
| 2012/0110423 A1 | * | 5/2012 | Song ................... | H03M 13/098 714/799 |
| 2015/0098283 A1 | * | 4/2015 | Ku ....................... | H03K 3/0375 365/193 |

* cited by examiner

*Primary Examiner* — Jason Lappas
(74) *Attorney, Agent, or Firm* — IP & T Group LLP

(57) ABSTRACT

A semiconductor device includes a pipe latch suitable for sequentially latching data in response to a pipe input control signal and sequentially outputting data in response to a pipe output control signal, a pipe latch control unit suitable for generating the pipe input/output control signals in response to a command signal and latency information, and resetting the pipe input/output control signals in response to a pipe reset signal, and an error detection unit suitable for receiving the pipe input control signal and the pipe output control signal, detecting a latency error, and generating the pipe reset signal.

4 Claims, 6 Drawing Sheets

SEMICONDUCTOR DEVICE AND SEMICONDUCTOR SYSTEM INCLUDING THE SAME

CROSS-REFERENCE TO RELATED APPLICATIONS

This application is a division of U.S. patent application Ser. No. 14/106,821 filed on Dec. 15, 2013, which claims priority of Korean Patent Application No. 10-2013-0119845, filed on Oct. 8, 2013. The disclosure of each of the foregoing applications is incorporated herein by reference in its entirety.

BACKGROUND

1. Field

Exemplary embodiments of the present invention relate to a semiconductor design technology, and more particularly, to a semiconductor device having a pipe latch and a semiconductor system including the same.

2. Description of the Related Art

A semiconductor memory device includes a plurality of pipe latches for latching input data, and performs a write operation for aligning and writing the input data in response to a strobe signal DQS. While the semiconductor memory device is performing the write operation, training is performed through a write leveling operation to guarantee that a clock signal and a data strobe signal reach each memory device within an appropriate timing, so that a stable operation is performed.

FIG. 1 is a timing diagram illustrating data training of a conventional semiconductor device.

Referring to FIG. 1, pipe input/output control signals WPIPE_IN<0:1> and WPIPE_OUT<0:1> become fail after abnormal data training.

When the data training is started, a write command 10 is applied and a phase of a data strobe signal DQS is compared with a phase of a clock signal CLK after column address strobe (CAS) write latency (CWL: latency from the input of a write command to the input of write data from outside). At this time, even though an edge of the data strobe signal DQS and an edge of the clock signal CLK are aligned, when the data strobe signal DQS is not inputted in response to the CAS write latency CWL, an abnormal operation occurs in a pipe latch.

FIG. 1 illustrates the case in which the data strobe signal DQS is inputted at a time point (CWL-1) earlier than the CAS write latency CWL by one clock. In this case, the pipe input control signal WPIPE_IN<0> used in the pipe latch becomes fail. Then, even though the data strobe signal DQS corresponding to a subsequently inputted write command 20 is inputted in response to the CAS write latency CWL, the pipe input/output control signals WPIPE_IN<0:1> and WPIPE_OUT<0:1> become fall.

The pipe input/output control signals WPIPE_IN<0:1> and WPIPE_OUT<0:1> are sequentially activated in the data training. That is, the pipe input control signals WPIPE_IN<0:1> are sequentially activated and the pipe output control signals WPIPE_OUT<0:1> are sequentially activated.

SUMMARY

Various exemplary embodiments of the present invention are directed to a semiconductor device capable of controlling abnormal pipe input/output control signals which may occur in data training.

In accordance with an exemplary embodiment of the present invention, a semiconductor device may include a pipe latch suitable for sequentially latching data in response to a pipe input control signal and sequentially outputting data in response to a pipe output control signal, a pipe latch control unit suitable for generating the pipe input/output control signals in response to a command signal and latency information, and resetting the pipe input/output control signals in response to a pipe reset signal, and an error detection unit suitable for receiving the pipe input control signal and the pipe output control signal, detecting a latency error, and generating the pipe reset signal.

In accordance with another exemplary embodiment of the present invention, a semiconductor device may include a pipe latch suitable for sequentially latching data in response to a pipe input control signal and sequentially outputting data in response to a pipe output control signal, a pipe latch control unit suitable for generating the pipe input control signal and the pipe output control signal in response to a write command signal and latency information, and resetting the pipe input/output control signals in response to a pipe reset signal, and an activation control unit suitable for generating the pipe reset signal that is activated in a period except for a write period determined in response to the write command signal, the latency information, and a burst length.

In accordance with another exemplary embodiment of the present invention, a semiconductor system may include a memory device suitable for latching data in response to a data strobe signal that is outputted from a controller, and the controller suitable for retransmitting the data in response to a reset signal that is generated by the memory device, wherein the memory device includes a pipe latch suitable for sequentially latching and outputting data in response to pipe input/output control signals, a pipe latch control unit suitable for generating the pipe input/output control signals in response to a command signal and latency information, and resetting the pipe input/output control signals in response to the reset signal, and an error detection unit suitable for receiving the pipe input control signal and the pipe output control signal, detecting a latency error, and generating the reset signal.

According to the semiconductor device of the embodiments, a stable pipe latch operation is ensured, so that it is possible to increase the reliability of a data training operation.

DETAILED DESCRIPTION

Figure 1:
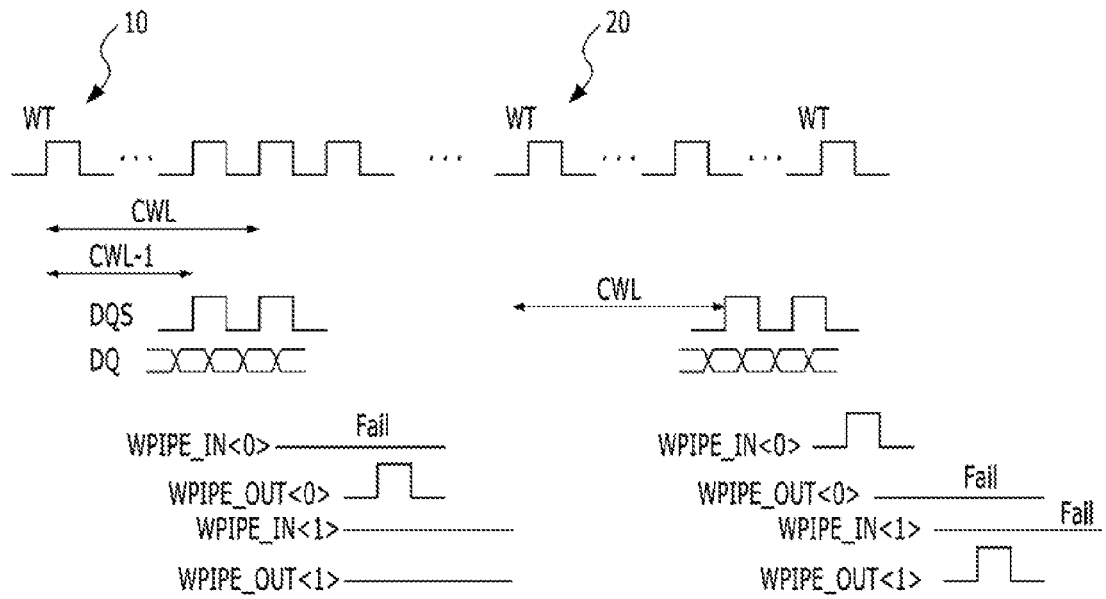
FIG. 1 is a timing diagram illustrating data training of a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
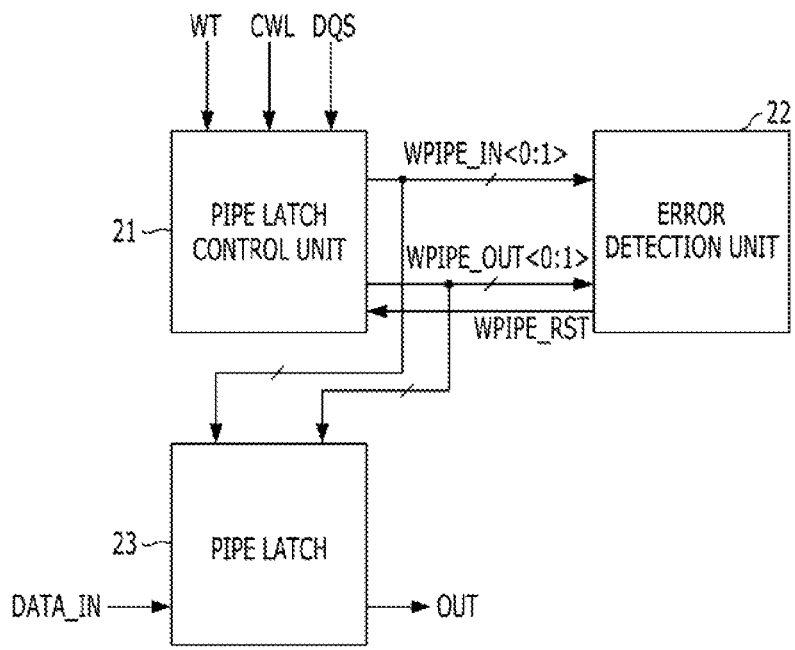
FIG. 2 is a block diagram illustrating a semiconductor device in accordance with an exemplary embodiment of the present invention.

FIG. 2 is a block diagram illustrating a semiconductor device in accordance with an exemplary embodiment of the present invention.

Referring to FIG. 2, the semiconductor device includes a pipe latch control unit 21, an error detection unit 22, and a pipe latch 23.

The pipe latch control unit 21 may receive a write command WT, a CAS write latency CWL, and a data strobe signal DQS, and perform a reset operation on pipe input control signals WPIPE_IN<0:1> and pipe output control signals WPIPE_OUT<0:1> in response to a pipe reset signal WPIPE_RST provided from the error detection unit 22.

The error detection unit 22 receives the pipe input control signals WPIPE_IN<0:1> and the pipe output control signals WPIPE_OUT<0:1> from the pipe latch control unit 21, detects a latency error, and generates the pipe reset signal WPIPE_RST in response to the latency error.

The latency error indicates the situation in which the data strobe signal DQS is not inputted in response to the CAS write latency CWL, and as illustrated in FIG. 1, in the latency error situation, the pipe input/output control signals WPIPE_IN<0:1> and WPIPE_OUT<0:1> are not sequentially activated.

The pipe latch 23 may sequentially latch data in response to the pipe input control signals WPIPE_IN<0:1>, and sequentially output data in response to the pipe output control signals WPIPE_OUT<0:1>.

The semiconductor device according to the exemplary embodiment of the present invention is able to detect the state in which the pipe input control signals WPIPE_IN<0:1> and the pipe output control signals WPIPE_OUT<0:1> are not sequentially activated, and to reset the pipe input control signals WPIPE_IN<0:1> and the pipe output control signals WPIPE_OUT<0:1> based on the detected state.

Figure 3:
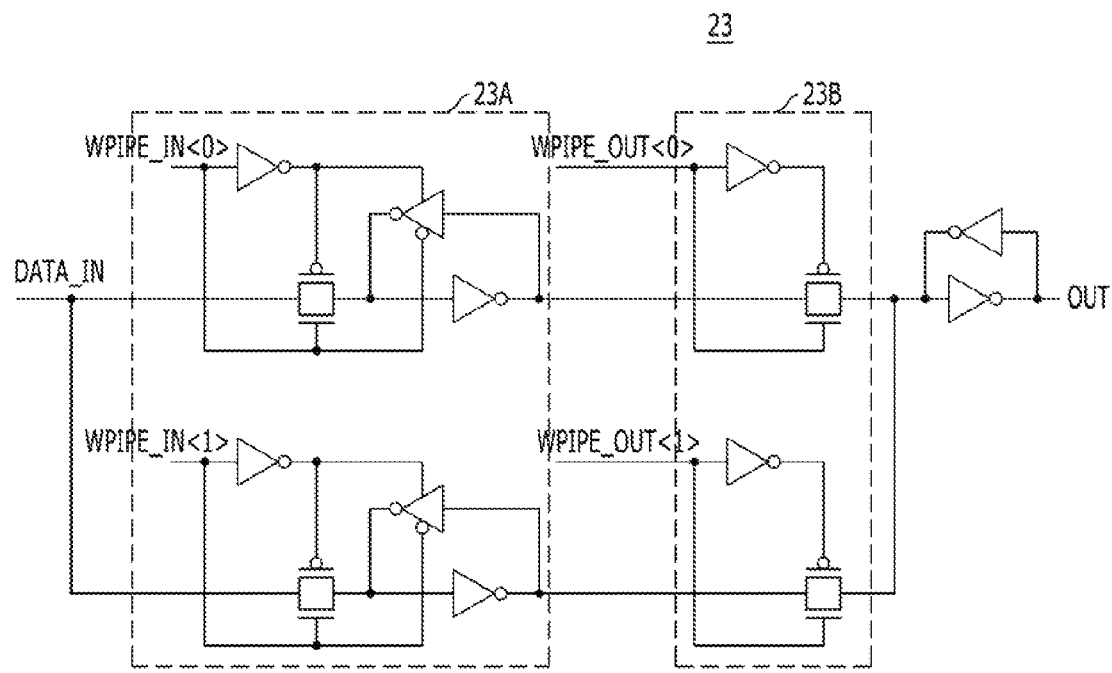
FIG. 3 is a circuit diagram illustrating a pipe latch shown in FIG. 2.

FIG. 3 is a circuit diagram illustrating the pipe latch 23 shown in FIG. 2.

Referring to FIG. 3, the pipe latch 23 may include an input latch section 23A that receives the pipe input control signals WPIPE_IN<0:1>, and an output latch section 23B that receives the pipe output control signals WPIPE_OUT<0:1>. FIG. 3 illustrates a latch circuit in which the input latch section 23A and the output latch section 23B correspond to two pipe input control signals WPIPE_IN<0:1> and two pipe output control signals WPIPE_OUT<0:1>. However, the number of pipe input control signals, the number of pipe output control signals, and the number of latch circuits may be changed according to design.

The input latch section 23A may latch data DATA_IN in response to the pipe input control signals WPIPE_IN<0:1>, and the output latch section 23B may output the data latched by the input latch section 23A in response to the pipe output control signals WPIPE_OUT<0:1>.

With referenced to FIG. 2 and FIG. 3, the operation of the circuit will be simply described.

When the data strobe signal DQS is inputted in response to the write command WT, the pipe latch control unit 21 generates the pipe input/output control signals WPIPE_IN<0:1> and WPIPE_OUT<0:1>. At this time, when the pipe input control signals WPIPE_IN<0:1> and the pipe output control signals WPIPE_OUT<0:1> are not sequentially activated, the error detection unit 22 may output the pipe reset signal WPIPE_RST to the pipe latch control unit 21, and the pipe latch control unit 21 may output the pipe input control signals WPIPE_IN<0:1> and the pipe output control signals WPIPE_OUT<0:1>, which have been reset in response to the pipe reset signal WPIPE_RST, to the pipe latch 23. The pipe latch 23 may substantially prevent erroneous data from being latched and outputted by the reset pipe input/output control signals WPIPE_IN<0:1> and WPIPE_OUT<0:1>.

Figure 4:
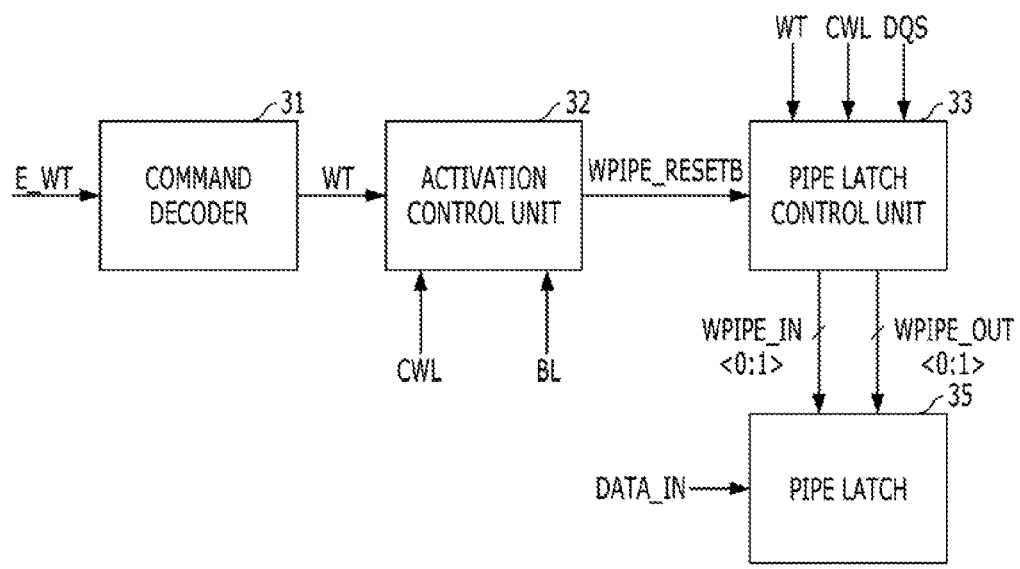
FIG. 4 is a block diagram illustrating a semiconductor device in accordance with an exemplary embodiment of the present invention.

FIG. 4 is a block diagram illustrating a semiconductor device in accordance with an exemplary embodiment of the present invention.

Referring to FIG. 4, the semiconductor device includes a command decoder 31, an activation control unit 32, a pipe latch control unit 33, and a pipe latch 35.

The command decoder 31 decodes an external command E_WT and outputs a write command WT. The external command E_WT may include a chip select signal CS, a column address strobe signal CAS, a row address strobe signal RAS, a write enable signal WE, and the like.

The activation control unit 32 may generate a pipe reset signal WPIPE_RESETB in a specific period. In the exemplary embodiment, the specific period may include a period except for a write period. The activation control unit 32 may generate the pipe reset signal WPIPE_RESETB for resetting the pipe latch control unit 33 in response to the write command WT provided from the command decoder 31, and information on CAS write latency CWL and a burst length BL.

The CAS write latency CWL may indicate latency until write data is inputted from outside after the write command WT is applied, and the burst length BL may indicate the number of bits that are inputted/outputted at a time according to a prefetch function of a memory device. In other words, it is possible to define the write period based on the CAS write latency CWL and the burst length BL.

In addition, the activation control unit 32 may set an activation period or a deactivation period of the pipe reset signal WPIPE_RESETB based on the CAS write latency CWL. Particularly, the activation period or the deactivation period may be set by shifting the write command WT by the CAS write latency CWL using a shifter and the like, for example.

The pipe latch control unit 33 controls input/output operations of the pipe latch 35, generates the pipe input control signals WPIPE_IN<0:1> and the pipe output control signals WPIPE_OUT<0:1> in response to a write command signal WT and latency information, e.g., the CAS write latency CWL, and resets pipe input control signals WPIPE_IN<0:1> and pipe output control signals WPIPE_OUT<0:1> in response to the pipe reset signal WPIPE_RESETB provided from the activation control unit 32 and a data strobe signal DQS.

The pipe latch 35 may sequentially latch data DATA_IN in response to the pipe input control signals WPIPE_IN<0:1>, and sequentially output data in response to the pipe output control signals WPIPE_OUT<0:1>.

Figure 5A:
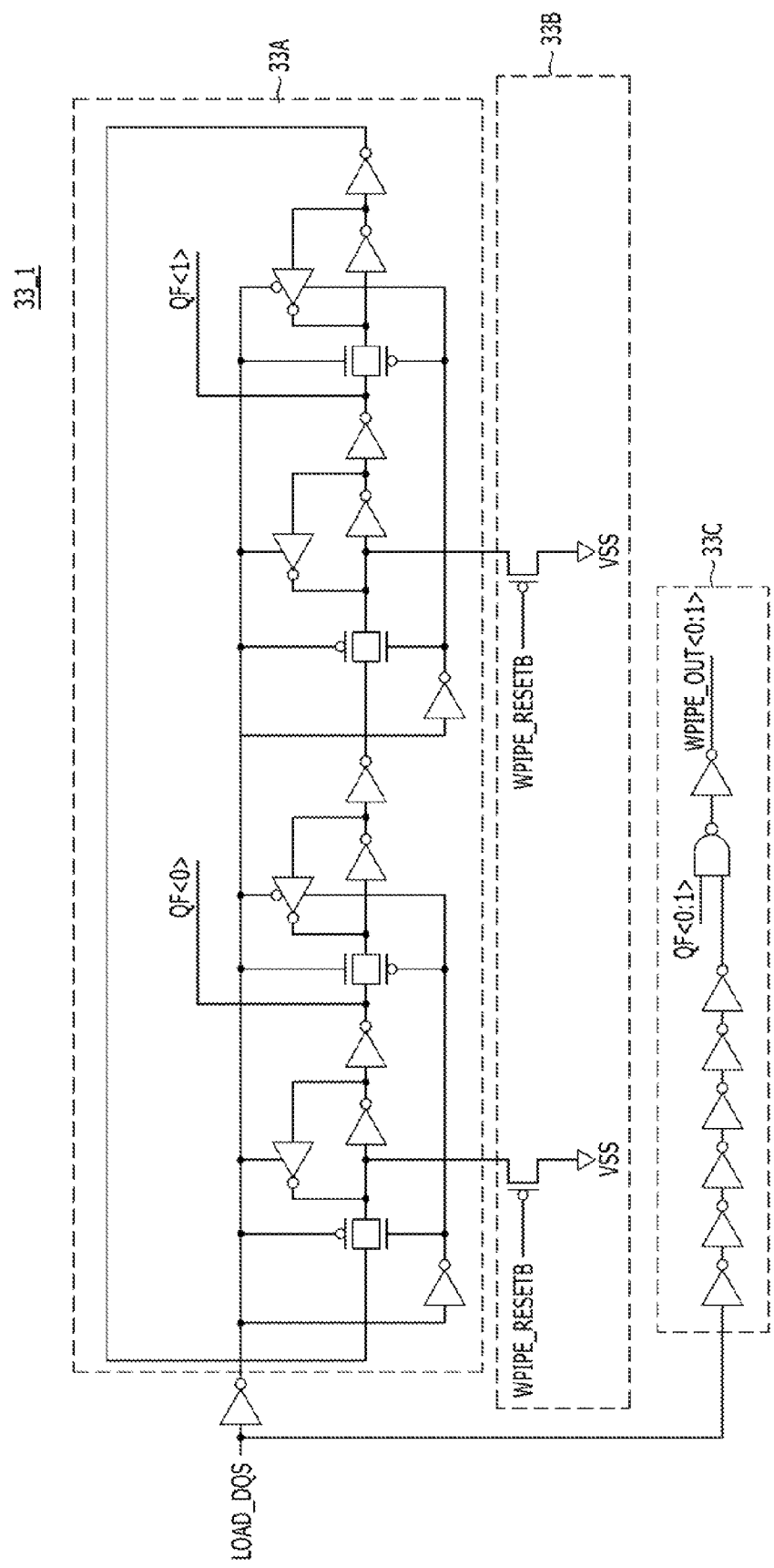
FIGS. 5A and 5B are circuit diagrams illustrating a pipe latch control unit shown in FIG. 4
Figure 5B:
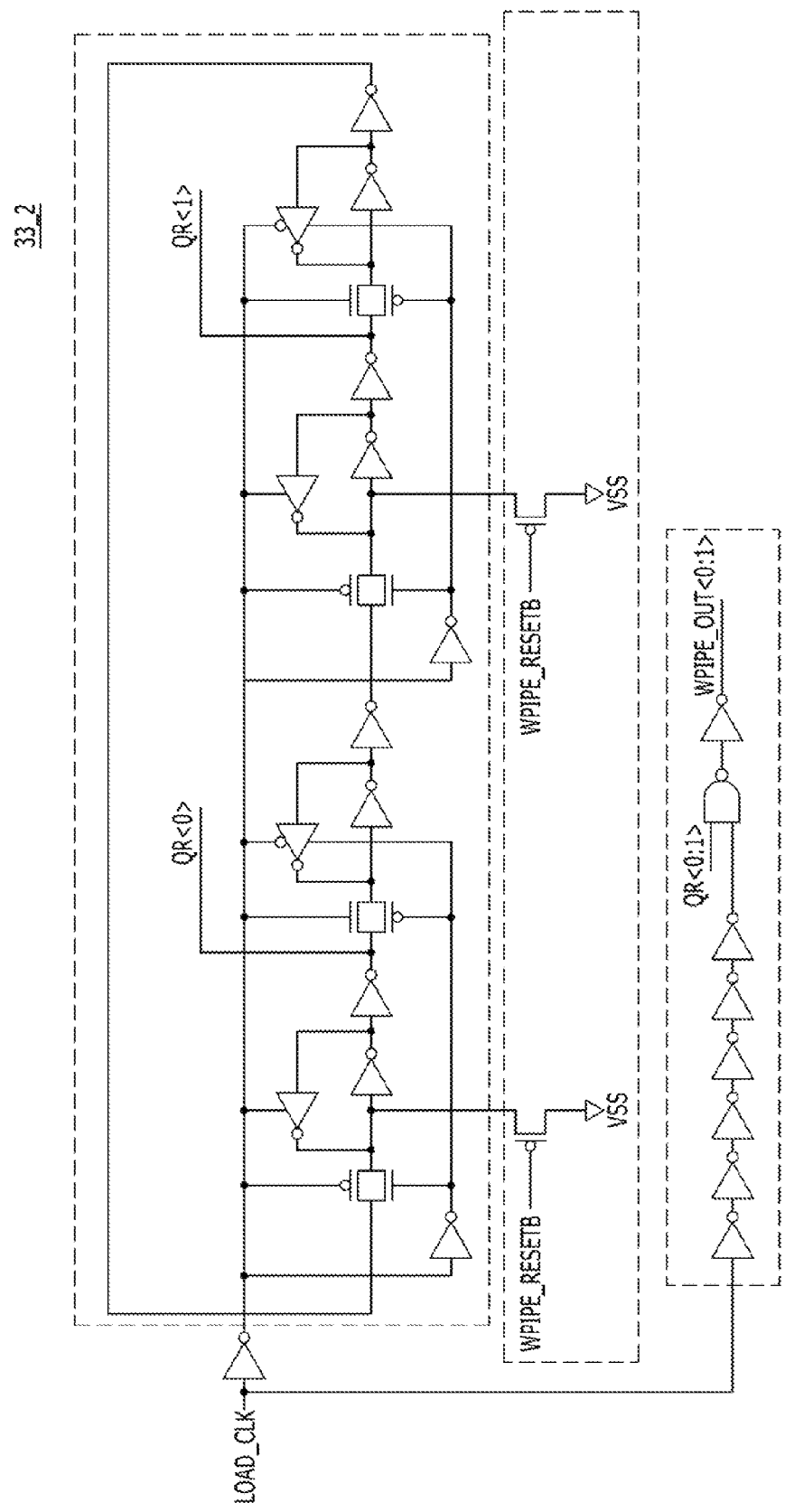

FIGS. 5A and 5B are circuit diagrams illustrating the pipe latch control unit 33 shown in FIG. 4. FIG. 5A is a circuit diagram illustrating a pipe output control signal generation unit 33_1 of the pipe latch control unit 33 shown in FIG. 4, and FIG. 5B is a circuit diagram illustrating a pipe input control signal generation unit 33_2 of the pipe latch control unit 33 shown in FIG. 4.

For the purpose of convenience, the two pipe output control signals WPIPE_OUT<0:1> and the two pipe input control signals WPIPE_OUT<0:1> will be representatively described. However, a plurality of circuits corresponding to a plurality of pipe output control signals and a plurality of circuits corresponding to a plurality of pipe input control signals may be further provided.

Referring to FIG. 5A, a load strobe signal LOAD_DQS inputted to the pipe output control signal generation unit 33_1 of the pipe latch control unit 33 may be a signal derived from the data strobe signal DQS. For example, the load strobe signal LOAD_DQS is generated after CAS write latency+burst length/2 (CWL+BL/2) in a write operation, and is a reference signal of the pipe output control signals WPIPE_OUT<0:1> in a data strobe signal (DQS) domain.

In FIG. 5A, the pipe output control signal generation unit 33_1 may include a shifting section 33A, a reset section 33B, and a pipe output control signal generation section 33C.

The shifting section 33A may receive the load strobe signal LOAD_DQS, and generate a first node signal QF<0> and a second node signal QF<1> through a shifting operation.

The reset section 33B may apply a ground voltage (VSS) level to the shifting section 33A in response to a "L" level of the pipe reset signal WPIPE_RESETB.

The pipe output control signal generation section 33C may generate the pipe output control signals WPIPE_OUT<0:1> in response to the load strobe signal LOAD_DQS, the first node signal QF<0>, and the second node signal QF<1>.

In FIG. 5A, the pipe output control signal generation unit 33_1 for generating and resetting the pipe output control signals WPIPE_OUT<0:1> has been described. The shifting section 33A and the pipe output control signal generation section 33C may be called a generation section that generates the pipe output control signals WPIPE_OUT<0:1> based on the load strobe signal LOAD_DQS.

In FIG. 5B, the pipe input control signal generation unit 33_2 for generating and resetting the pipe input control signals WPIPE_IN<0:1> has been described. At this time, a circuit, which generates the pipe input control signals WPIPE_IN<0:1> by replacing the load strobe signal LOAD_DQS with an input signal LOAD_CLK, may be configured in the same manner, and may reset the pipe input control signals WPIPE_IN<0:1> based on the input signal LOAD_CLK.

According to the exemplary embodiment of the present invention, it is possible to control the reset operation of the shifting section 33A in response to the pipe reset signal WPIPE_RESETB.

Hereinafter, an operation will be described with reference to FIG. 4 to FIG. 5B.

The command decoder 31 receives the external command E_WT, generates the write command WT, and outputs the write command WT to the activation control unit 32.

The activation control unit 32 generates the pipe reset signal WPIPE_RESETB in a period except for a write period based on the CAS write latency CWL and the burst length BL in response to the write command WT.

The pipe latch control unit 33 generates the pipe input control signals WPIPE_IN<0:1> and the pipe output control signals WPIPE_OUT<0:1>, and controls the reset operation of the pipe input control signals WPIPE_IN<0:1> and the pipe output control signals WPIPE_OUT<0:1> in response to the pipe reset signal WPIPE_RESETB. In detail, the reset section 33B applies the ground voltage (VSS) level to the shifting section 33A in response to the "L" level of the pipe reset signal WPIPE_RESETB. At this time, the first node signal QF<0> and the second node signal QF<1> become a "L" level. Furthermore, the pipe output control signal generation section 33C may reset the pipe output control signals WPIPE_OUT<0:1> to a "L" level in response to the first node signal QF<0> and the second node signal QF<1>.

Figure 6:
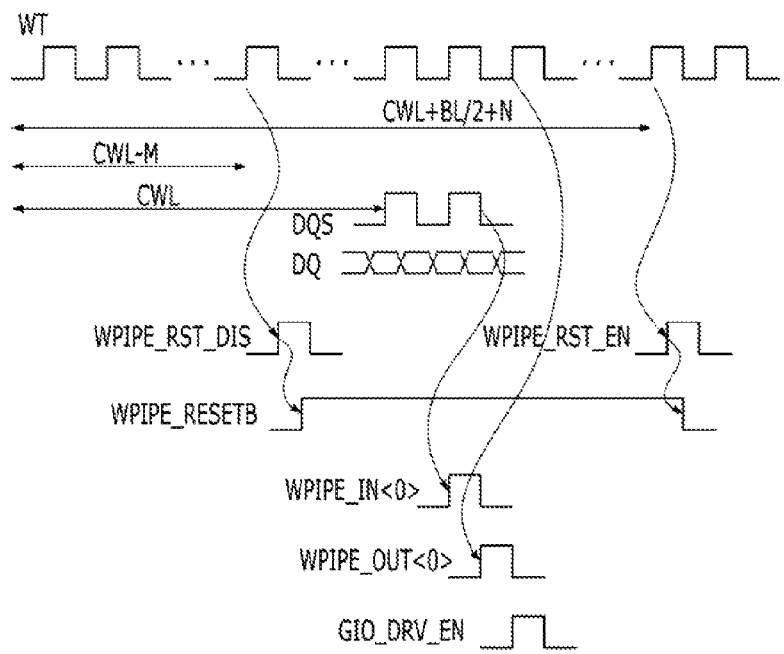
FIG. 6 is a diagram explaining an operation of an activation control unit shown in FIG. 4.

FIG. 6 is a diagram explaining an operation of the activation control unit 32 shown in FIG. 4.

FIG. 6 illustrates a write period in which data DQ and the data strobe signal DQS are inputted after the write command WT is applied, and the timing at which the pipe reset signal WPIPE_RESETB is deactivated in the write period. Hereinafter, a reset disable signal WPIPE_RST_DIS and a reset enable signal WPIPE_RST_EN are generated by shifting the write command WT, and may be used for setting an activation period or a deactivation period of the pipe reset signal WPIPE_RESETB.

The write period may be defined as CAS write latency+burst length/2 (BL/2)+N from the CAS write latency CWL after the write command WT is applied. At the time point earlier than the write period by a M clock after the write command WT is applied, the reset disable signal WPIPE_RST_DIS may be generated. When the reset disable signal WPIPE_RST_DIS is activated, the pipe reset signal WPIPE_RESETB is deactivated to a "H" level. After the write period ends, the reset enable signal WPIPE_RST_EN is delayed by an N clock and is activated. After the write period, the pipe input control signal WPIPE_IN<0> and the pipe output control signal WPIPE_OUT<0> are generated. Furthermore, M and N are positive integers and M and N are factors that may be adjusted according to design.

When the time point, at which the reset enable signal WPIPE_RST_EN is activated after the reset disable signal WPIPE_RST_DIS is generated, is defined as a first period. The first period includes a pipe operation period. In the first period, the pipe reset signal WPIPE_RESETB is deactivated to a "H" level. When all periods, except for the first period, are defined as a second period, the pipe reset signal WPIPE_RESETB is activated to a "L" level all the time in the second period. At this time, the pipe input control signal WPIPE_IN<0> and the pipe output control signal WPIPE_OUT<0> become a "L" level. That is, when the write command WT is consecutively inputted, the pipe input control signal WPIPE_IN<0> and the pipe output control signal WPIPE_OUT<0> may be reset all the time in a period except for a minimum critical period including the write period.

The pipe reset signal WPIPE_RESETB may be replaced with other signals. That is, the pipe reset signal WPIPE_RESETB may be replaced with all signals that are activated in a period except for the write period. For example, it is possible to use a power-up signal PWRUP indicating that power has been initialized.

Figure 7:
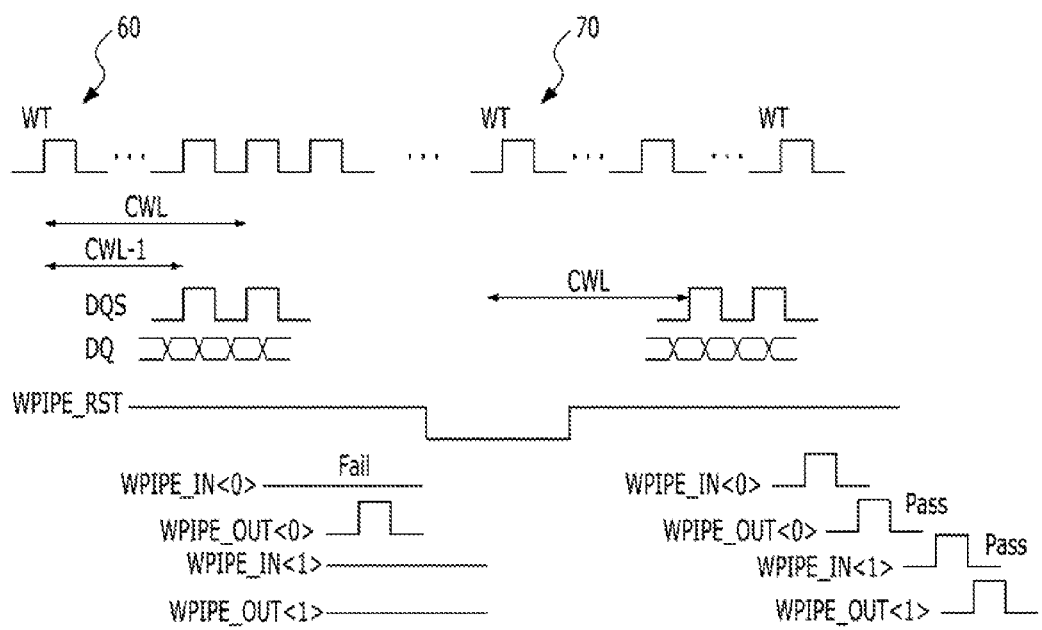
FIG. 7 is a timing diagram explaining a training operation shown in FIG. 4 to FIG. 5B.

FIG. 7 is a timing diagram explaining a training operation shown in FIG. 4 to FIG. 5B.

Referring to FIG. 7, in the training operation, when a write command 60 is inputted, phases of a data strobe signal DQS and a clock signal CLK are compared with each other, and the data strobe signal DQS is inputted at an abnormal time point (for example, CWL-1), the pipe input control signal WPIPE_IN<0> becomes fail. Furthermore, after the abnormal training operation, even through a write command is applied at a normal time point, the pipe input/output control signals WPIPE_IN<0:1> and WPIPE_OUT<0:1> become fail.

However, in the exemplary embodiment of the present invention, the pipe reset signal WPIPE_RESETB is activated before a consecutive write command 70, and the pipe input/output control signals WPIPE_IN<0:1> and WPIPE_OUT<0:1> are reset, so that it is possible to substantially prevent failure of the pipe input/output control signals WPIPE_IN<0:1> and WPIPE_OUT<0:1>.

Consequently, after the consecutive write command 70 is applied, it is possible to sequentially generate the pipe input/output control signals WPIPE_IN<0:1> and WPIPE_OUT<0:1>.

Figure 8:
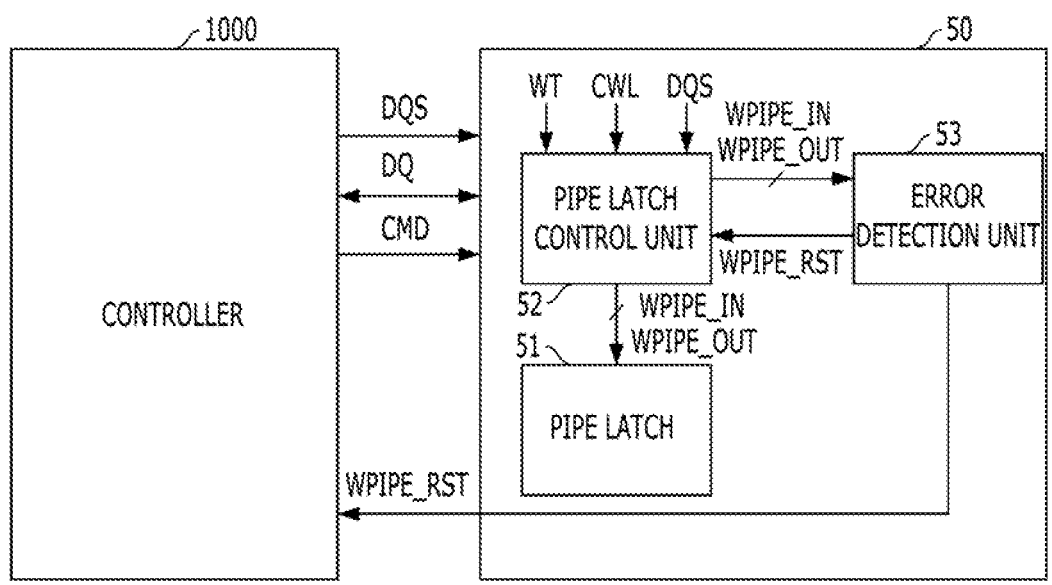
FIG. 8 is a block diagram illustrating a semiconductor system in accordance with an exemplary embodiment of the present invention.

FIG. 8 is a block diagram illustrating a semiconductor system in accordance with an exemplary embodiment of the present invention.

Referring to FIG. 8, the semiconductor system may include a controller 1000 and a memory device 50.

The memory device 50 may receive a command CMD, a data strobe signal DQS, and data DQ from the controller 1000. The memory device 50 may latch the data DQ in response to the data strobe signal DQS, and output the latched data to the controller 1000.

The memory device 50 may include a pipe latch 51, a pipe latch control unit 52, and an error detection unit 53.

The pipe latch 51 may sequentially latch data in response to a pipe input control signal WPIPE_IN, and sequentially output data in response to a pipe output control signal WPIPE_OUT. Furthermore, the pipe latch 51 may reset the pipe input control signal WPIPE_IN and the pipe output control signal WPIPE_OUT in response to a pipe reset signal WPIPE_RST.

The pipe latch control unit 52 may generate the pipe input control signal WPIPE_IN and the pipe output control signal WPIPE_OUT in response to a write command WT and latency information CWL, and control input/output operations of the pipe latch 51 in response to the generated pipe input/output control signals.

The error detection unit 53 may receive the pipe input control signal WPIPE_IN and the pipe output control signal WPIPE_OUT, detect a latency error, generate the pipe reset signal WPIPE_RST, and output the pipe reset signal WPIPE_RST to the pipe latch control unit 52 and the controller 1000.

The controller 1000 may retransmit data to the memory device 50 in response to the pipe reset signal WPIPE_RST.

Hereinafter, an operation of the exemplary embodiment according to the present invention will be described with reference to FIG. 8.

The error detection unit 53 may receive the pipe input control signal WPIPE_IN and the pipe output control signal WPIPE_OUT from the pipe latch control unit 52, and detect the latency error. The pipe latch control unit 52 may reset the pipe input control signal WPIPE_IN and the pipe output control signal WPIPE_OUT in response to the pipe reset signal WPIPE_RST outputted from the error detection unit 53, and output the pipe input control signal WPIPE_IN and the pipe output control signal WPIPE_OUT to the pipe latch 51. The pipe latch 51 may input/output data in response to the pipe input control signal WPIPE_IN and the pipe output control signal WPIPE_OUT outputted from the pipe latch control unit 52.

The controller 1000 may retransmit data corresponding to the pipe input control signal WPIPE_IN and the pipe output control signal WPIPE_OUT, in which an error has occurred, in response to the pipe reset signal WPIPE_RST outputted from the error detection unit 53. For example, the pipe input/output control signals WPIPE_IN and WPIPE_OUT may not be sequentially generated, so that data may not be normally latched in the pipe latch 51. Accordingly, the memory device 50 may detect the latency error of the pipe input/output control signals WPIPE_IN and WPIPE_OUT, reset the pipe input/output control signals WPIPE_IN and WPIPE_OUT, and receive data, which has not been latched, from the controller 1000 again.

According to the exemplary embodiments of the present invention as described above, it is possible to substantially prevent an abnormal pipe latch operation by resetting the pipe input/output control signals WPIPE_IN and WPIPE_OUT after the write period.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
    a pipe latch suitable for sequentially latching data in response to a pipe input control signal and sequentially outputting data in response to a pipe output control signal;
    a pipe latch control unit suitable for generating the pipe input control signal and the pipe output control signal in response to a write command signal and latency information, and resetting the pipe input/output control signals in response to a pipe reset signal for resetting the pipe latch control unit; and
    an activation control unit suitable for generating the pipe reset signal that is activated in a period except for a write period determined in response to the write command signal, the latency information, and a burst length, wherein the activation control unit sets an activation period or a deactivation period of the pipe reset signal based on the latency information.

2. The semiconductor device of claim 1, wherein the activation control unit deactivates the pipe reset signal by shifting the write command signal by the latency information.

3. The semiconductor device of claim 1, wherein the pipe latch control unit comprises:
    a generation section suitable for receiving a data strobe signal and a clock signal and generating the pipe input/output control signals; and
    a reset section suitable for resetting the generation section in response to the pipe reset signal.

4. The semiconductor device of claim 1, further comprising:
    a command decoder suitable for decoding an external command and outputting a write command signal.

* * * * *